United States Patent
Chen et al.

(10) Patent No.: US 7,016,185 B2
(45) Date of Patent: Mar. 21, 2006

(54) DECORATIVE/ERGONOMIC COVER OR SHEATH FOR COMPUTER PERIPHERALS AND OTHER ELECTRONIC DEVICES

(75) Inventors: Zhen-Bang Chen, Taipei (TW); Cheng-Yi Xiao, Taipei (TW); Yi-Ru Li, Taipei (TW)

(73) Assignee: Kye Systems Corp., Taipei (TW)

( * ) Notice: Subject to any disclaimer, the term of this patent is extended or adjusted under 35 U.S.C. 154(b) by 112 days.

(21) Appl. No.: 10/714,968

(22) Filed: Nov. 18, 2003

(65) Prior Publication Data

US 2005/0105262 A1    May 19, 2005

(51) Int. Cl.
*G06F 1/16* (2006.01)
(52) U.S. Cl. .................. 361/683; 200/310; 206/305
(58) Field of Classification Search ........ 361/679–687, 361/724–727; 200/310, 333; 150/165; 206/305, 206/320; 463/47; 341/23
See application file for complete search history.

(56) References Cited

U.S. PATENT DOCUMENTS

| 609,934 A | 8/1898 | Heusch |
| 6,285,299 B1 * | 9/2001 | King-DeBaun ............ 341/23 |
| 6,433,779 B1 | 8/2002 | Woolman .................. 345/163 |
| 6,706,983 B1 * | 3/2004 | Tsao et al. ................. 200/310 |
| 2005/0075172 A1 * | 4/2005 | Coleman .................... 463/47 |

* cited by examiner

*Primary Examiner*—Hung Van Duong
(74) *Attorney, Agent, or Firm*—Bacon & Thomas, PLLC

(57) ABSTRACT

An electronic device, such as a computer peripheral device, includes a comfortable holding-sheath. The holding-sheath has a sleeve portion that extends around the electronic device, and a holding portion graspable by a user to enable the user to more comfortably hold the device and facilitate its operation. The holding-sheath further has a protection portion extending therefrom so as to protect at least a button, switch, or connecting portion of the device from being contaminated.

16 Claims, 5 Drawing Sheets

DECORATIVE/ERGONOMIC COVER OR SHEATH FOR COMPUTER PERIPHERALS AND OTHER ELECTRONIC DEVICES

BACKGROUND OF THE INVENTION

1. Field of the Invention

The present invention relates to a computer peripheral device, such as a computer mouse, and in particular, to a device which has an integral holding-sheath or cover that enables customization of the device by providing various outlines, colors and/or a more ergonomic, comfortable feel. The invention may also be applied to other portable electronic devices, such as game controllers, digital cameras, and so forth.

2. Description of the Prior Art

Computer peripheral devices, such as a computer mouse, keyboard, game controller, barcode reader, card reader, or digital camera . . . etc., are familiar to modern computer users. Due to limitations dictated by the featured functions of the devices, it is difficult to create distinctive or more ergonomic designs and still maintain an original, manufacturer identifiable design outlook without increasing production costs.

One solution to this problem is to provide a cover or sheath that fits over the peripheral. For example, a known cover is described in U.S. Pat. No. 6,433,779. As described in this patent, a hard and long cover is designed to couple to a round computer mouse. The cover is adjustable relative to the round mouse in order to adapt to different users who have variable lengths of palm.

Another cover is disclosed in U.S. Pat. No. 6,099,934. In the design disclosed in this patent, a mouse is disposed in a bag-like cover 10, which has a fastening means 44 so as to pack the whole mouse inside the cover. The cover also has an opening under the mouse, which exposes a coordinate detecting unit of the mouse to the working surface over which the mouse is moved during use.

While providing a degree of decorative variety or ergonomics, neither of the covers described in the prior patent documents completely solves the problem about promoting the comfort in use and creating visual effect at the same time. For example, the bagging design disclosed in U.S. Pat. No. 609,934, in which the entire mouse is wrapped, has the disadvantage of fully writing off the original design outlook of the mouse.

SUMMARY OF THE DISCLOSURE

It is accordingly an objective of the present invention to provide a computer peripheral device with more comfortable operation, by providing a holding-sheath or cover that has a circle portion, and a holding portion integrally extended therefrom.

It is another objective of the present invention to provide a computer peripheral device with a protection function, by providing a protection portion that integrally extends from the holding-sheath so as to protect the button, switch or connecting port of the peripheral device from contamination.

It is yet another objective of the present invention to provide a computer peripheral device in which outline designs may be varied, by providing an extension portion that integrally extends from the outside of the holding-sheath.

DETAILED DESCRIPTION OF THE PREFERRED EMBODIMENTS

The following detailed description is of the best presently contemplated modes of carrying out the invention. This description is not to be taken in a limiting sense, but is made merely for the purpose of illustrating general principles of embodiments of the invention. The scope of the invention is best defined by the appended claims.

Figure 1:
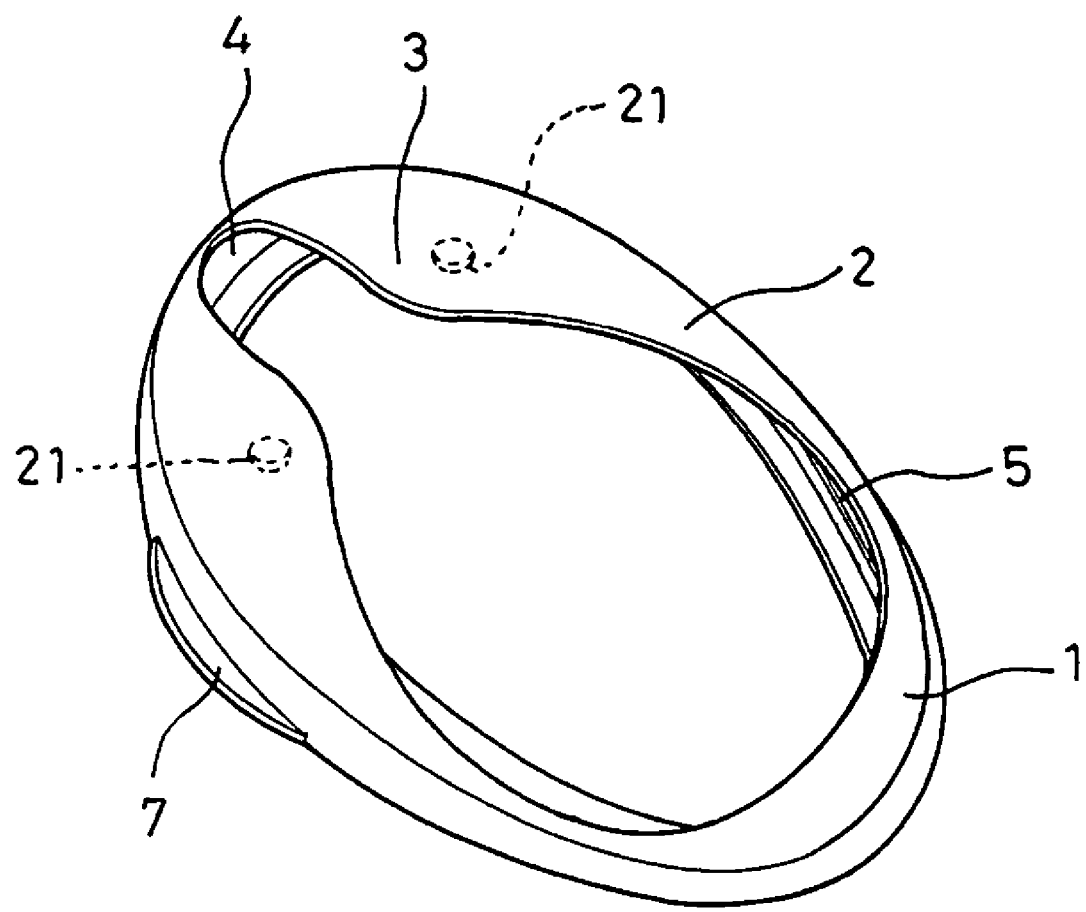
FIG. 1 is a perspective view of the present invention.
Figure 2:
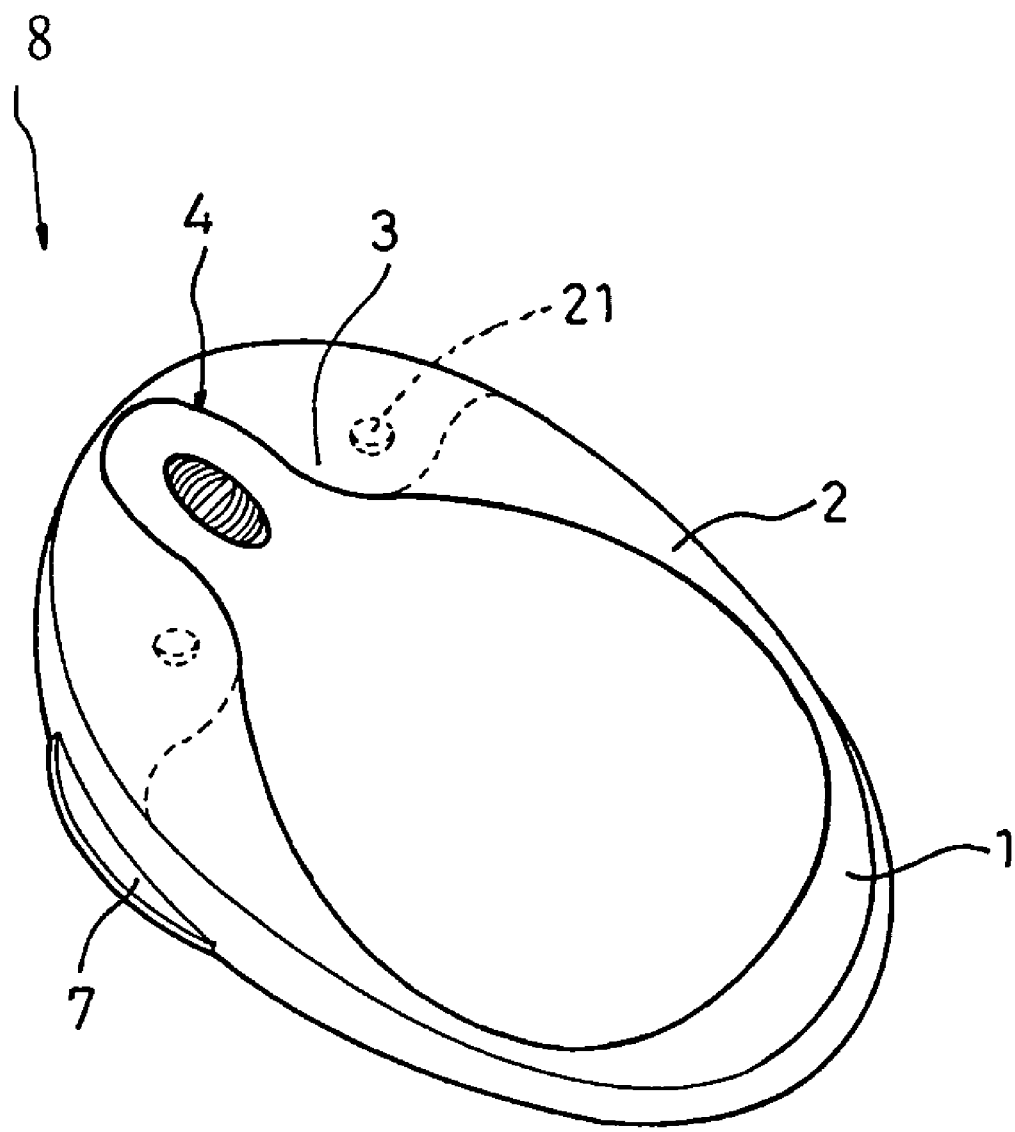
FIG. 2 is a perspective view of a computer mouse implementation the present invention.

Referring to FIGS. 1 and 2, a holding-sheath according to a preferred embodiment of the invention is made of rubber-like material, which is soft and flexible, thereby enabling the user to easily exchange different sheaths as desired. The holding-sheath is arranged to be fitted onto a computer mouse 8 having a housing which is mainly composed of an upper housing and a lower housing, and at least an electronic device located inside the housing capable of communicating with a computer system. The holding-sheath is integrally made, and includes a generally circular or arc-shaped sleeve portion 1 that extends around the bottom periphery of the mouse, such that the primary upper housing and the lower housing are exposed. In addition, a holding portion 2 extends from the sleeve portion 1 over a part of the surface of the upper housing or the lower housing of mouse 8, the holding portion being arranged to be grasped by a user to facilitate operation of the device by the user. Furthermore, a protection portion 3 extends from the holding-sheath so as to protect at least a button, switch, or connecting port of the mouse 8 from being contaminated. An opening portion 4 is formed between the two protection portions 3, which allows a roller to protrude therefrom. When the buttons of the mouse are covered by the protection portion 3, a no-key-design is therefore formulated, creating an unique visual effect.

In practical use, the sleeve portion 1 can be fitted just around the periphery of the mouse 8, and the protection portion 3 can be located at any desired portion of the mouse to protect at least a switch, connecting port, or the like. Furthermore, the material of any or all of these portions may be transparent or translucent, with various colors.

Finally, in the embodiment of FIG. 2, an extending portion 7 extends from the sleeve portion 1 so as to vary the appearance of the mouse 8.

In order to firmly fix the holding-sheath around the mouse 8, the inner surface of the sleeve portion 1, the holding portion 2, or the protection portion 3 has at least a protrusion 21 for engagement with at least a corresponding recess located on the housing (not shown). Furthermore, a rib 5, shown in FIG. 3 but also suitable for use in the embodiment of FIG. 2, may be formed at the inner surface of the sleeve portion 1 or holding portion 2 so as to hold a corresponding recess located on the housing.

Figure 3:
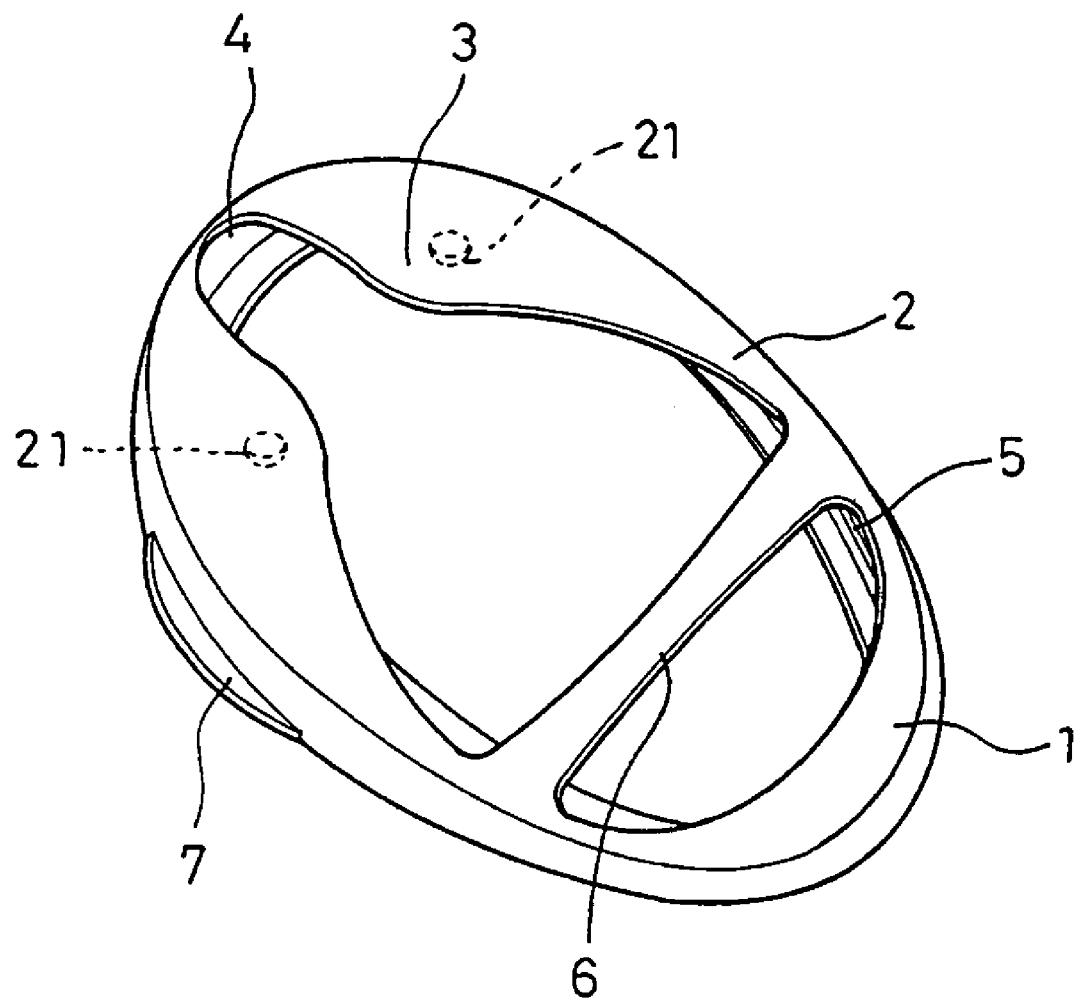
FIG. 3 is a perspective view of a second embodiment according to the present invention.

In the embodiment illustrated in FIG. 3, an auxiliary holding portion 6 is connected over the upper housing of the mouse. In that case, a user may feel more comfortable, and the outlook of the mouse 8 is quite different than the original one.

Figure 4:
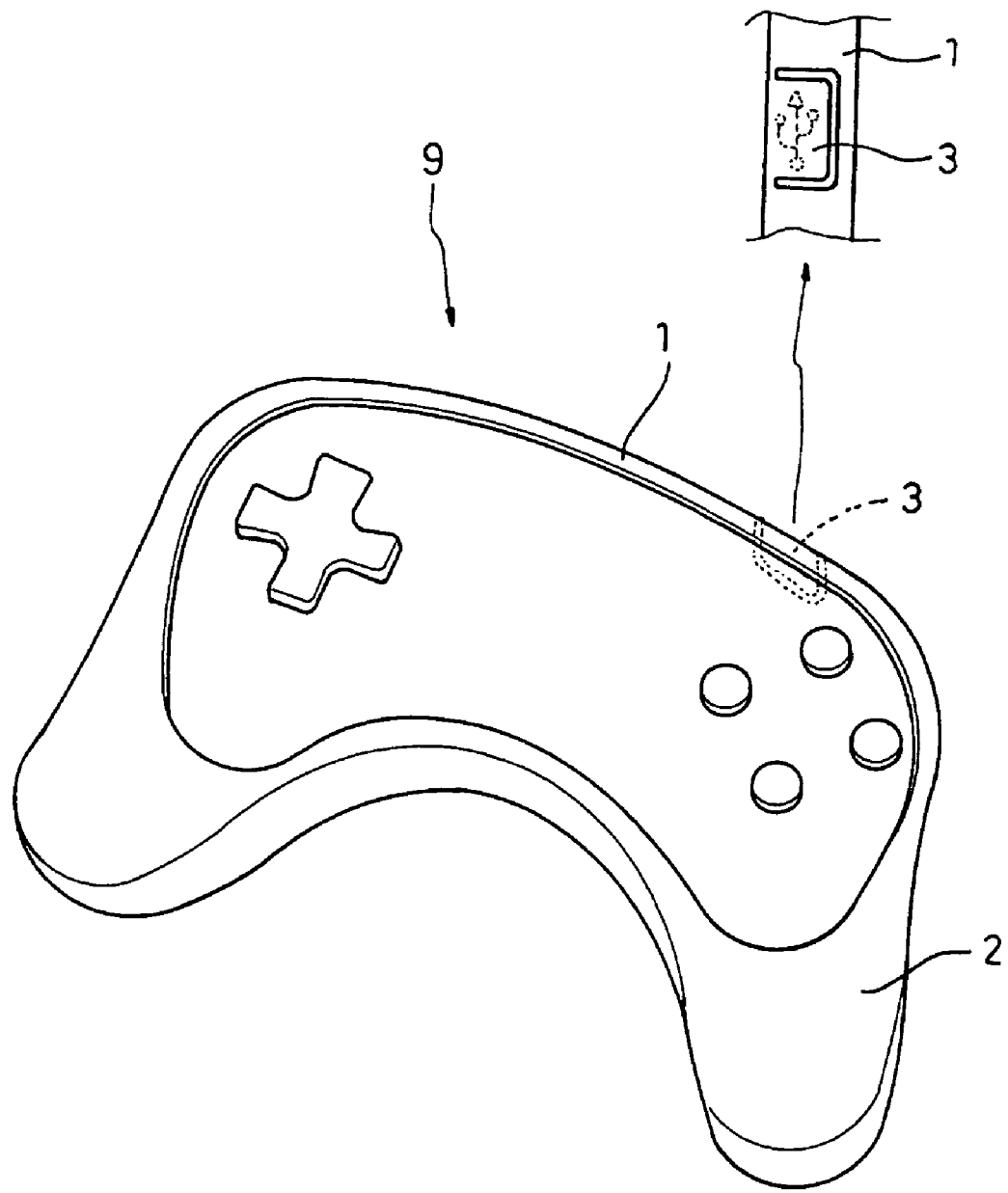
FIG. 4 is a perspective view of the present invention applied to a game controller.

Referring to FIG. 4, which shows a variation of the embodiments of FIGS. 2 and 3, applied to a game controller 9. The sleeve portion 1 fits around the periphery of the game controller 9, and the holding portion 2 can be grasped or engaged by a user to increase the comfort of the user during operation of the device. Also the free-opening protection portion 3 is arranged to protect at least a connecting port of the game controller 9 from contamination.

Figure 5:
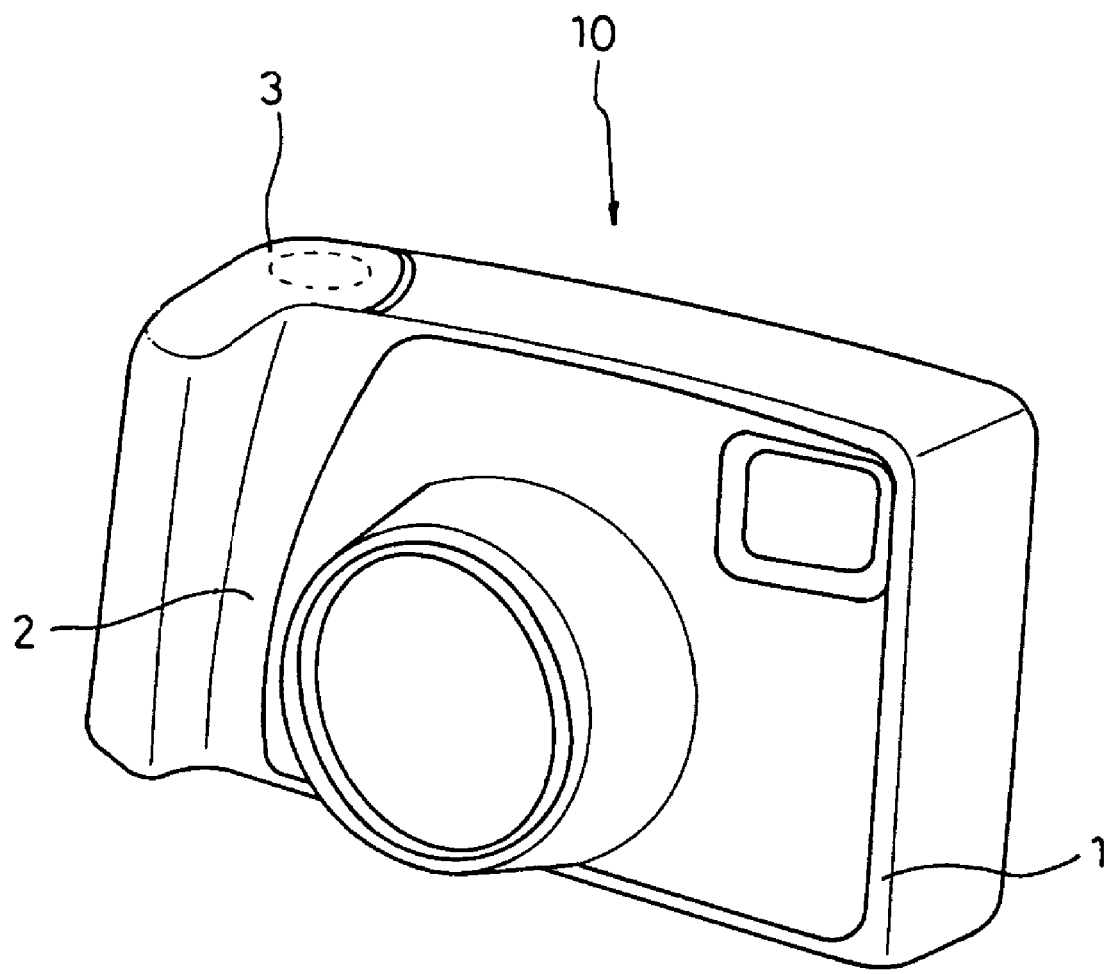
FIG. 5 is a perspective view of the present invention applied to a digital camera.

Referring to FIG. 5, which shows application of the principles of the invention to a digital camera 10. The sleeve portion 1 fits around the periphery of the camera 10, and the holding portion 2 again can promote the operation by a user by enhancing comfort. Also a free-opening protection portion 3 is arranged to protect at least a button of the camera 10 from being contamination.

While the description above refers to particular embodiments of the present invention, it will be understood that many modifications may be made without departing from the spirit thereof. The accompanying claims are intended to cover such modifications as would fall within the true scope and spirit of the present invention.

What is claimed is:

1. A cover for an electronic device having a housing, comprising:
    a flexible and integrally formed holding-sheath member having a sleeve portion that extends around a periphery of the electronic device housing such that an upper portion and a lower portion of the housing of the electronic device is exposed, and a holding portion that may be gripped by a user of the electronic device to facilitate operation of the device by the user,
    wherein the holding-sheath member has a free-opening protection portion extending therefrom and arranged to protect at least one of a button, a switch or a connecting port.

2. The cover as claimed in claim 1, wherein the sleeve is generally circular and is arranged to fit around the periphery of a computer mouse.

3. The cover as claimed in claim 1, wherein the device is selected from the group consisting of a computer mouse, track ball, keyboard, game controller, joystick, card reader, camera, and barcode reader.

4. The cover as claimed in claim 1, wherein an inner face of the holding-sheath member includes a protrusion for engaging a corresponding opening in the electronic device to secure the cover to the electronic device.

5. The cover as claimed in claim 1, wherein an inner face of the holding-sheath member has at least one rib for engaging a corresponding groove in the electronic device to secure the cover to the electronic device.

6. The cover as claimed in claim 1, wherein the outside of the holding-sheath member has an extension to facilitate gripping of the electronic device or vary an appearance of the electronic device.

7. The cover as claimed in claim 1, wherein the holding-sheath member is made of rubber.

8. The cover as claimed in claim 1, wherein the holding portion further has an auxiliary holding portion to further facilitate operation of the electronic device.

9. An electronic device, comprising:
    a housing containing electronic components; and a flexible and integrally formed holding-sheath member having a sleeve portion that extends around a periphery of the housing such that an upper portion and a lower portion of the housing of the electronic device is exposed, and a holding portion that may be gripped by a user of the electronic device to facilitate operation of the device by the user,
    wherein the holding-sheath member has a free-opening protection portion extending therefrom and arranged to protect at least one of a button, a switch or a connecting port.

10. The electronic device as claimed in claim 9, wherein the electronic device is a computer mouse and the sleeve is generally circular and arranged to fit around the periphery of the computer mouse.

11. The electronic device as claimed in claim 9, wherein the device is selected from the group consisting of a computer mouse, track ball, keyboard, game controller, joystick, card reader, camera, and barcode reader.

12. The electronic device as claimed in claim 9, wherein an inner face of the holding-sheath member includes a protrusion for engaging a corresponding opening in the electronic device to secure the electronic device to the electronic device.

13. The electronic device as claimed in claim 9, wherein an inner face of the holding-sheath member has at least one rib for engaging a corresponding groove in the electronic device to secure the electronic device to the electronic device.

14. The electronic device as claimed in claim 9, wherein the outside of the holding-sheath member has an extension to facilitate gripping of the electronic device or vary an appearance of the electronic device.

15. The electronic device as claimed in claim 9, wherein the holding-sheath member is made of rubber.

16. The electronic device as claimed in claim 9, wherein the holding portion further has an auxiliary holding portion to further facilitate operation of the electronic device.

* * * * *